United States Patent
Schnapp et al.

(10) Patent No.: US 8,782,113 B2
(45) Date of Patent: Jul. 15, 2014

(54) METHOD AND CONTROLLER FOR PROCESSING DATA MULTIPLICATION IN RAID SYSTEM

(75) Inventors: Michael Gordon Schnapp, Taipei Hsien (TW); Ching-Hao Chou, Taipei (TW)

(73) Assignee: Infortrend Technology, Inc., Taipei Hsien (TW)

( * ) Notice: Subject to any disclaimer, the term of this patent is extended or adjusted under 35 U.S.C. 154(b) by 1349 days.

(21) Appl. No.: 11/513,385

(22) Filed: Aug. 31, 2006

(65) Prior Publication Data

US 2007/0067697 A1    Mar. 22, 2007

Related U.S. Application Data

(60) Provisional application No. 60/596,142, filed on Sep. 2, 2005.

(51) Int. Cl.
   *G06F 7/00*    (2006.01)
(52) U.S. Cl.
   USPC .......................................... 708/492; 714/770
(58) Field of Classification Search
   CPC ............................... G06F 9/30; G06F 11/1076
   USPC .......................................... 708/492; 714/770
   See application file for complete search history.

(56) References Cited

U.S. PATENT DOCUMENTS

| | | | | |
|---|---|---|---|---|
| 4,037,093 A | * | 7/1977 | Gregg et al. | 708/492 |
| 4,584,686 A | * | 4/1986 | Fritze | 714/784 |
| 5,499,253 A | * | 3/1996 | Lary | 714/770 |
| 6,823,425 B2 | * | 11/2004 | Ghosh et al. | 711/114 |
| 6,912,687 B1 | | 6/2005 | Gates et al. | |
| 7,219,289 B2 | * | 5/2007 | Dickson | 714/752 |
| 2005/0108613 A1 | | 5/2005 | Kobayashi | |
| 2006/0080377 A1 | * | 4/2006 | Chien | 708/492 |

OTHER PUBLICATIONS

Ing-yi Chen et al., An XOR Based Reed-Solomon Algorithm for Advanced RAID Systems, 2004, Proceedings of the 19th IEEE International Symposium on Defect and Fault Tolerance in VLSI Systems, pp. 1-8.*
H. Peter Anvin, The mathematics of RAID-6, Dec. 2004, pp. 1-8.*
Ben Freeman, Storage Basics: Choosing a RAID Controller, May 7, 2004, enterprisestorage.com, pp. 1-18.*

* cited by examiner

*Primary Examiner* — Chuong D Ngo
*Assistant Examiner* — Kevin G Hughes
(74) *Attorney, Agent, or Firm* — Rosenberg, Klein & Lee

(57) ABSTRACT

The invention discloses a method and controller for processing data multiplication in a RAID system. Map tables are generated for all values in a field, respectively. The length of an XOR operation unit is chosen to be appropriate w bits (e.g., 332 bits or 64 bits). One or several XOR operation units form a multiplication unit of a data sector. When computing on-line, data in a disk drive of a disk array are performed with XOR operations in accordance with one of the map tables using an XOR operation unit as one unit while computing on the multiplication unit to obtain a product of multiplication. Making use of the RAID system established according to the disclosed method, only XOR operations are required to compute parity data or recover damaged user data. Moreover, several calculations can be performed simultaneously. Therefore, the efficiency of the RAID system can be effectively improved.

31 Claims, 5 Drawing Sheets

Step 1: $K \cdot (b_0\ b_1\ b_2\ b_3\ b_4\ b_5\ b_6\ b_7) = (b_0'\ b_1'\ b_2'\ b_3'\ b_4'\ b_5'\ b_6'\ b_7')$

Step 2: $K \cdot (c_0\ c_1\ c_2\ c_3\ c_4\ c_5\ c_6\ c_7) = (c_0'\ c_1'\ c_2'\ c_3'\ c_4'\ c_5'\ c_6'\ c_7')$

Step 3: $K \cdot (d_0\ d_1\ d_2\ d_3\ d_4\ d_5\ d_6\ d_7) = (d_0'\ d_1'\ d_2'\ d_3'\ d_4'\ d_5'\ d_6'\ d_7')$

Step w: $K \cdot (z_0\ z_1\ z_2\ z_3\ z_4\ z_5\ z_6\ z_7) = (z_0'\ z_1'\ z_2'\ z_3'\ z_4'\ z_5'\ z_6'\ z_7')$

METHOD AND CONTROLLER FOR PROCESSING DATA MULTIPLICATION IN RAID SYSTEM

RELATED APPLICATIONS

This application claims priority to provisional patent application Ser. No. 60/596,142, filed Sep. 2, 2005, and entitled "Method And Controller For Processing Data Multiplication In RAID System", which is incorporated herein by reference.

BACKGROUND OF THE INVENTION

1. Field of Invention

The invention relates to a method and controller for processing data multiplication in a RAID system and, in particular, to a method and controller for processing simultaneously a large amount of data multiplication operations in a RAID system.

2. Related Art

The redundant array of independent disk (RAID) is a disk subsystem designed to enhance access efficiency, to provide better fault-tolerance ability, or both. The RAID utilizes a disk striping technique to enhance the access efficiency. Data are stored separately according to bytes or groups of bytes in many different disk drives, so that the read/write I/O requests can be performed in parallel on many disk drives. On the other hand, a mirroring technique or a disk striping technique with distributive parity data is used to provide the fault-tolerance ability.

The ability of fault tolerance is related to the number of parity data sets stored in the RAID system. Taking RAID5 as an example, it is designed to store an extra set of parity data in addition to the user data. The parity data is usually called the P value, or sometimes the XOR parity because it is the calculation result of XOR operations on the corresponding user data. The formula is:

$$P = D_0 + D_1 + D_2 + \ldots + D_{n-1} \quad (1)$$

where + represents the XOR operation, P represents the parity data series, $D_0, D_1, D_2, \ldots, D_{n-1}$ represents the user data series, respectively, and n denotes the number of user data disks. As RAID5 only stores one parity data set, it can only allow one of the user data disks having errors (e.g. damaged or out of order) at a time. The data on the user data disk having errors is recovered using the corresponding P value and the corresponding data on the other normal user data disks by means of the same XOR operations. For example, if $D_1$ has an error, then $D_1$ can be recovered as follows:

$$D_1 = D_0 + D_2 + \ldots + D_{n-1} + P$$

where + also denotes the XOR operation.

Considering the fault tolerance demand on more than one user data disk, some systems are designed to store multiple parities. "Reed-Solomon Codes" are usually adopted to set up this type of RAID systems, which allow more than one disk drive having errors. RAID6 belongs to this category. It has at least two parities to allow two or more disk drives having errors at the same time.

Take the RAID6 system with two parities as an example. The two parities are conventionally called P and Q. The formula for computing P is the same as the one in the RAID5 system. The value of Q is obtained using the following formula.

$$Q = g^0 \cdot D_0 + g^1 \cdot D_1 + g^2 \cdot D_2 + \ldots + g^{n-1} \cdot D_{n-1} \quad (2)$$

If two data disks $D_x$, $D_y$ are damaged, then a careful derivation gives:

$$D_x = A \cdot (P + P_{xy}) + B \cdot (Q + Q_{xy}) \quad (3)$$

$$D_y = (P + P_{xy}) + D_x \quad (4)$$

where A and B are constants only related to x and y:

$$A = g^{y-x} \cdot (g^{y-x} + 1)^{-1} \quad (5)$$

$$B = g^{-x} \cdot (g^{y-x} + 1)^{-1} \quad (6)$$

and $P_{xy}$ and $Q_{xy}$ are the values of P and Q when both $D_x$ and $D_y$ are 0, i.e., $$P_{xy} + D_x + D_y = P \quad (7)$$

$$Q_{xy} + g^x \cdot D_x + g^y \cdot D_y = Q \quad (8)$$

Aside from the fact that the power "y−x" is a normal subtraction, the other algebraic operations in Eqs. (2) to (8) are all operations following the rules of the Galois Field. Moreover, g is a generator of the Galois Field. It usually be chosen as g=2.

The addition operation in the Galois Field is in fact the XOR operation. Its multiplication operation is related to the field of $GF(2^a)$. For the definitions, properties, and operational rules, please refer to (1) "The mathematics of RAID6", H. Peter Anvin, December, 2004; and (2) "A Tutorial on Reed-Solomon Coding for Fault-Tolerance in RAID-like Systems", James S. Plank, Software-Practice & Experience, 27(9), pp 995-1012, September, 1997. Eqs. (1) to (8) given above can be found in Ref. (1).

Since the Galois Field is a closed field and there always exists an r for an arbitrary number X satisfying $X=2^r$, in the prior art looking up table is a typical method to deal with the multiplication operations in the Galois Field (see Ref. (2)). Take $GF(2^a)$ as an example. To find the product of any two numbers X and Y, the procedure is as follows:

1. Look up a log table to find r and s, which satisfies $X=2^r$ and $Y=2^s$. Therefore, $X \cdot Y = 2^{r+s} = 2^t$.
2. If $t \geq 2^a - 1$, then $t = t - (2^a - 1)$.
3. Look up an inverse log table to obtain the value of $2^t$.

It is seen from Eqs. (2) and (3) that a large amount of multiplication operations of Galois Field are required for computing Q or recovering the damaged $D_x$. In particular, it involves the multiplication of a constant with various different numbers. By means of the conventional method of looking up table, the system has to compute byte by byte and each multiplication operation of Galois Field requires 3 times of table looking up, 1 addition (or subtraction), 1 test and 1 modulo operation. Considering that the sizes of current storage media are frequently tens or hundreds of Giga bytes, such calculations are very inefficient and easy to become the bottleneck of the system. Therefore, how to improve and/or simplify and/or speed up the data multiplication operations in the RAID system is an important issue to be solved in the industry.

SUMMARY OF THE INVENTION

It is an objective of the invention to provide an effective algorithm and a controller implementing the algorithm, so that a huge amount of data multiplication operations can be performed simultaneously, thereby improving the efficiency of a RAID system.

In accordance with one feature of the invention, a method for data multiplication operations in a RAID system is provided. The method includes the steps of: generating at least one map table corresponding to at least one value in a field; selecting a length for an XOR operation unit and forming a multiplication unit using a plurality of the XOR operation units; and for the data stored in one disk drive of the RAID, performing at least one XOR operation using the XOR operation unit as one unit while computing on the multiplication unit according to a map table of the at least one map table, and further performing a plurality of the XOR operations to obtain the multiplication result.

In accordance with another feature of the invention, a controller for processing data multiplication operations in the RAID system is provided. The controller includes: a memory for temporarily storing target data provided by a data source; and a central processing circuit that generates at least one map table corresponding to at least one value in a field, performs at least one XOR operation for the target data stored in the memory using the XOR operation unit as one unit while computing on the multiplication unit according to a map table of the at least one map table, and further performs a plurality of the XOR operations to obtain the multiplication result.

In accordance with another feature of the invention, a method for processing data multiplication operations in a RAID system is provided, which is used to compute the product of a number K with a data series X. The method includes the steps of: generating a map table for the number K; selecting a length of an XOR operation unit, and forming a multiplication unit using a plurality of the XOR operation units; dividing the data series X into at least one the multiplication unit; for the multiplication unit and the map table associated with the number K, performing at least one XOR operation using the XOR operation unit as one unit according to the rules in the map table; and performing the multiplication operation in the previous step on all the multiplication units in the data series X. The multiplication result of the number K with the data series X is obtained once all the multiplication operations are done.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE INVENTION

Figure 1:
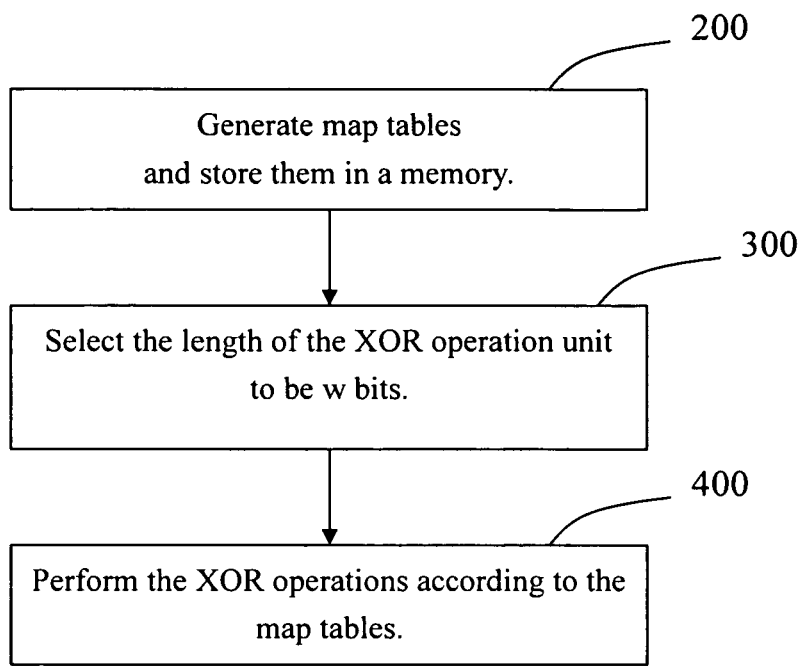
FIG. 1 is the primary flowchart of the invention.

The present invention will be apparent from the following detailed description, which proceeds with reference to the accompanying drawings, wherein the same references relate to the same elements.

A feature of the invention is in the appropriate definitions of operational rules for the data in the RAID system in order to speed up the data operations. In practice, the operational rules for the RAID data are commonly taken to be the algebraic rules of the Galois Field. Therefore, the algebraic rules of the Galois Field are used in the following embodiments. One embodiment of the invention is established on the hypothesis of $GF(2^a)$ of the Galois Field and its related algebraic rules. As a=8 is a currently-preferred choice in practice, most of the embodiments in this specification assume the domain of the Galois Field to be $GF(2^8)$. That is, the covered numbers are between 0 and 255. This is because $2^8$ is exactly the amount represented by one byte which is a basic unit of computer memory. The RAID system accordingly established can accommodate up to 255 user data disks, which are sufficient for normal RAID systems. Although the embodiments in this specification assume $GF(2^8)$, the invention can be applied to other cases with other hypotheses. In other embodiments of the invention, the disclosed technique may be applied in a Galois field domain different from $GF(2^8)$. Moreover, the invention can also use the operations in other fields or number systems, as long as appropriate operational rules are found in those fields or number systems.

Most of the embodiments described below take a RAID6 system with two parities as the example. However, the invention can be applied to more general cases. Other RAID 6 systems with more than two parities can be implemented with the disclosed method as well. The conventional formulas quoted in the specification are listed as follows.

$$P = D_0 + D_1 + D_2 + \ldots + D_{n-1} \quad (1)$$

$$Q = g^0 \cdot D_0 + g^1 \cdot D_1 + g^2 \cdot D_2 + \ldots + g^{n-1} \cdot D_{n-1} \quad (2)$$

$$D_x = A \cdot (P + P_{xy}) + B \cdot (Q + Q_{xy}) \quad (3)$$

$$D_y = (P + P_{xy}) + D_x \quad (4)$$

$$A = g^{y-x} \cdot (g^{y-x} + 1)^{-1} \quad (5)$$

$$B = g^{-x} \cdot (g^{y-x} + 1)^{-1} \quad (6)$$

where P and Q are the two parities in the RAID6 system; x and y are the serial numbers of the two data disks with errors; $D_x$ and $D_y$ are the user data corresponding to the two data disks x and y; A and B are constants only related to x and y; and $P_{xy}$ and $Q_{xy}$ are the values of P and Q when $D_x$ and $D_y$ are both 0, i.e., $$P_{xy} + D_x + D_y = P \quad (7)$$

$$Q_{xy} + g^x \cdot D_x + g^y \cdot D_y = Q \quad (8)$$

Aside from the fact that the power "y−x" is a normal subtraction, the other algebraic operations in Eqs. (1) to (8) are all operations following the rules of the Galois Field. Moreover, g is a generator of the Galois Field. It usually be chosen as g=2.

Definition of the Map Table

The map table is a key ingredient of the invention. It is defined as follows.

Suppose Y, X, and K are numbers in $GF(2^a)$. That is, Y, X, and K are all composed of "a" bits. If $y_i$ and $x_i$ represents the i-th bits of Y and X, respectively, then the vectors Y and X can be represented by:

$$Y = \begin{bmatrix} y_0 \\ y_1 \\ y_2 \\ \vdots \\ y_{a-1} \end{bmatrix}, X = \begin{bmatrix} x_0 \\ x_1 \\ x_2 \\ \vdots \\ x_{a-1} \end{bmatrix}$$

Let Y=K·X; that is, Y is the multiplication result of K with an arbitrary number X in the Galois Field. Here K is a given constant. Then the map table of K is defined as an a×a matrix $M_K$, whose elements $m_{i,j}$ (0<=i, j<=a−1) are 0 or 1 and satisfy:

$$Y = \begin{bmatrix} y_0 \\ y_1 \\ y_2 \\ \vdots \\ y_{a-1} \end{bmatrix} = \quad (9)$$

$$M_K \cdot X = \begin{bmatrix} m_{0,0} & m_{0,1} & m_{0,2} & \cdots & m_{0,a-1} \\ m_{1,0} & m_{1,1} & m_{1,2} & \cdots & m_{1,a-1} \\ m_{2,0} & m_{2,1} & m_{2,2} & \cdots & m_{2,a-1} \\ \vdots & \vdots & \vdots & & \vdots \\ m_{a-1,0} & m_{a-1,1} & m_{a-1,2} & \cdots & m_{a-1,a-1} \end{bmatrix}_K \begin{bmatrix} x_0 \\ x_1 \\ x_2 \\ \vdots \\ x_{a-1} \end{bmatrix}$$

In other words, $$y_i = \sum_{j=0}^{a-1} (m_{i,j} \cdot x_j), \quad (10)$$

wherein $0 \leq i \leq a-1$ where $m_{i,j} \cdot x_j = x_j$, if $m_{i,j} = 1$;

$m_{i,j} \cdot x_j = 0$, if $m_{i,j} = 0$.

The addition in the above operations is defined as the XOR operation. Since the elements in the matrix $M_K$ are either 0 or 1, the computation of $y_i$ can be regarded as follows: the data units $x_j$ corresponding to $m_{i,j}=1$ in the i-th row of the matrix $M_K$ are selected to do XOR operations.

Generation of the Map Table

The way of generating the map table is closely related to the algebraic rules of the Galois Field. Take $GF(2^8)$ as an example. Suppose the product of an arbitrary number X and 2 is X', then X' can be obtained from the following formula ("+" represents an XOR operation):

$$X' = \begin{bmatrix} x'_0 \\ x'_1 \\ x'_2 \\ x'_3 \\ x'_4 \\ x'_5 \\ x'_6 \\ x'_7 \end{bmatrix} = \begin{bmatrix} x_7 \\ x_0 \\ x_1 + x_7 \\ x_2 + x_7 \\ x_3 + x_7 \\ x_4 \\ x_5 \\ x_6 \end{bmatrix}; \text{ where } X = \begin{bmatrix} x_0 \\ x_1 \\ x_2 \\ x_3 \\ x_4 \\ x_5 \\ x_6 \\ x_7 \end{bmatrix}$$

Suppose the map table of K is a given matrix $M_K$ and the map table of $K'=2\cdot K$ is the matrix $M_{K'}$. Based on the above formula, one can derive the algorithmic rule A for generating $M_{K'}$ from $M_K$, shown in Table 1:

TABLE 1

$m'_{0j} = m_{7j}, 0 <= j <= 7$
$m'_{1j} = m_{0j}, 0 <= j <= 7$
$m'_{2j} = m_{1j} + m_{7j}, 0 <= j <= 7$
$m'_{3j} = m_{2j} + m_{7j}, 0 <= j <= 7$
$m'_{4j} = m_{3j} + m_{7j}, 0 <= j <= 7$
$m'_{5j} = m_{4j}, 0 <= j <= 7$
$m'_{6j} = m_{5j}, 0 <= j <= 7$
$m'_{7j} = m_{6j}, 0 <= j <= 7$

One algebraic feature of the Galois Field is as follows. Start from K=1 and multiply K each time by 2. The derived new K values do not repeat until covering all the numbers in the Galois Field. Take $GF(2^8)$ as an example. Start from K=1 and record it. Multiply K by 2 each time. After 255 times recording, the derived K values will cover all the $GF(2^8)$ numbers (except for 0).

According to the above-mentioned algebraic properties of the Galois Field and the algorithmic rule A, all map tables corresponding to different K values, i.e., all the matrix $M_K$, can be generated. Please refer to FIG. 1. According to an embodiment of the invention, generating the map tables (step 200) is the first key step of the invention and its implementation is described as follows.

Figure 2:
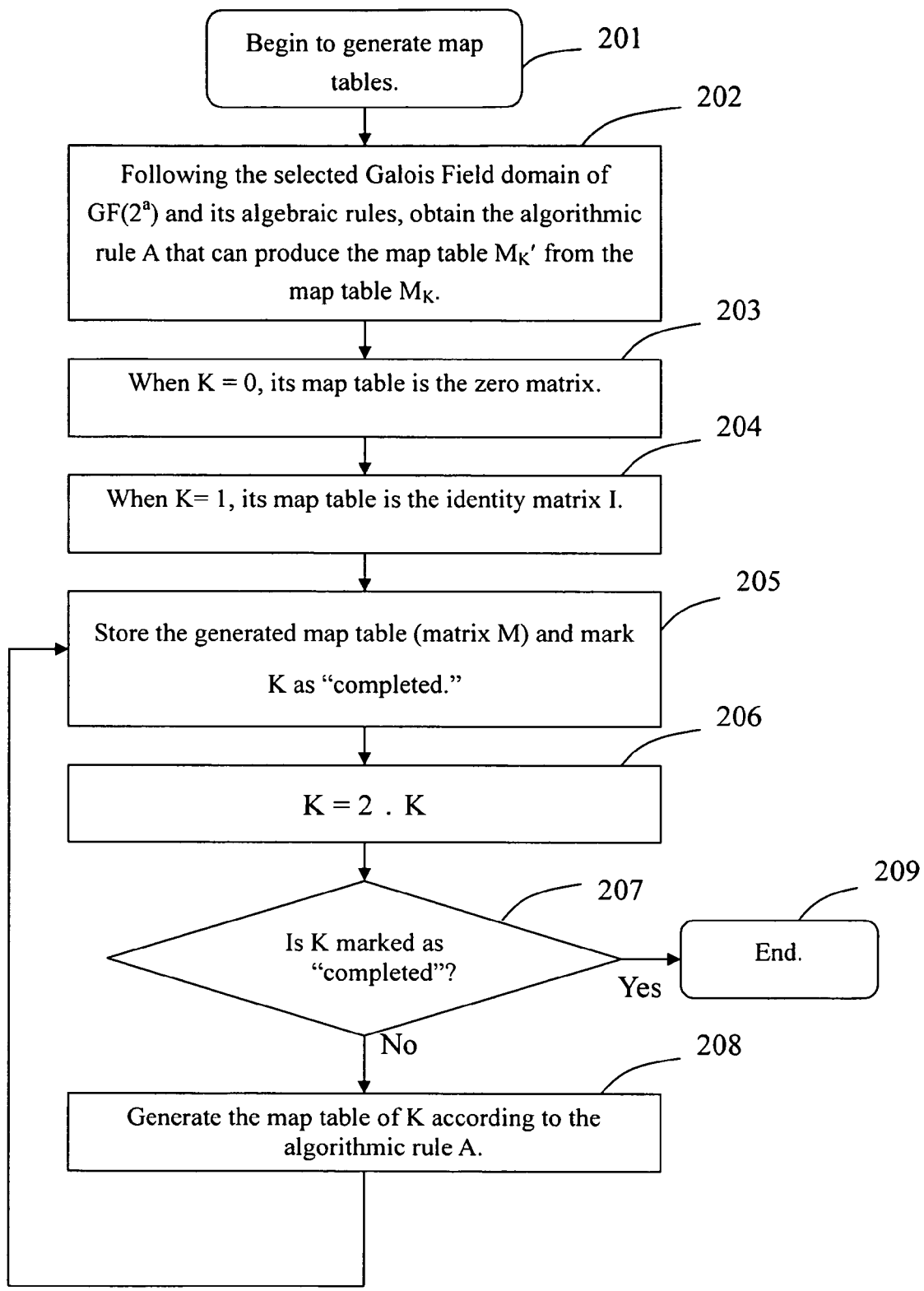
FIG. 2 is a flowchart of generating map tables according to the invention.

With reference to FIG. 2, while beginning to generate the map tables (step 201), the algorithmic rule A for generating the matrix $M_{K'}$ from the matrix $M_K$ should be determined first according to the selected Galois Field $GF(2^a)$ and its algebraic rules (step 202), where $M_K$ denotes the map table of a constant K and $M_{K'}$ denotes the map table of $2\cdot K$. When K=0, its map table is defined to be the zero matrix (step 203). When K=1, its map table is defined to be the identity matrix (step 204). The map tables thus generated are stored in the system memory. The K value whose map table is already produced is marked as "completed" (step 205). Afterwards, K starts from K=1 and is multiplied each time by 2 (step 206). The system checks whether the K value is marked as "completed" (step 207). If so, then the procedure is finished (step 209); otherwise, the map table $M_K$ of the new K value is generated according to the algorithmic rule A (step 208). The procedure then returns to step 205, marking K as "completed" and generating the next new K value (step 206), and so on. Steps 205~208 are repeated until K value is repeated and then the procedure is finished (step 209).

A few map tables in $GF(2^8)$ are listed below for references.

$K = 0$ $$M_0 = \begin{bmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}$$

$K = 2^0 = 1$ $$M_1 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

$K = 2^{27} = 12$ $$M_{12} = \begin{bmatrix} 1 & 1 & 1 & 0 & 0 & 0 & 1 & 0 \\ 0 & 1 & 1 & 1 & 0 & 0 & 0 & 1 \\ 1 & 1 & 0 & 1 & 1 & 0 & 1 & 0 \\ 1 & 0 & 0 & 0 & 1 & 1 & 1 & 1 \\ 0 & 0 & 1 & 0 & 0 & 1 & 0 & 1 \\ 0 & 0 & 0 & 1 & 0 & 0 & 1 & 0 \\ 1 & 0 & 0 & 0 & 1 & 0 & 0 & 1 \\ 1 & 1 & 0 & 0 & 0 & 1 & 0 & 0 \end{bmatrix}$$

$K = 2^{55} = 160$ $$M_{160} = \begin{bmatrix} 0 & 0 & 1 & 0 & 1 & 0 & 1 & 1 \\ 0 & 0 & 0 & 1 & 0 & 1 & 0 & 1 \\ 0 & 0 & 1 & 0 & 0 & 0 & 0 & 1 \\ 0 & 0 & 1 & 1 & 1 & 0 & 1 & 1 \\ 1 & 0 & 1 & 1 & 0 & 1 & 1 & 0 \\ 0 & 1 & 0 & 1 & 1 & 0 & 1 & 1 \\ 1 & 0 & 1 & 0 & 1 & 1 & 0 & 1 \\ 0 & 1 & 0 & 1 & 0 & 1 & 1 & 0 \end{bmatrix}$$

Application of the Map Table

One advantage of using the map tables for the multiplication operations in the Galois Field is to avoid the operations of shifting digits or looking up the log table/inverse log table. All it needs is the XOR operations.

Take $GF(2^8)$ as an example. Suppose Y is the product of a constant 20 and an arbitrary number X, i.e., Y=20·X, and the map table associated with 20 (the matrix $M_{20}$) is given as:

$$M_{20} = \begin{bmatrix} 0 & 0 & 0 & 0 & 1 & 0 & 1 & 0 \\ 0 & 0 & 0 & 0 & 0 & 1 & 0 & 1 \\ 1 & 0 & 0 & 0 & 1 & 0 & 0 & 0 \\ 0 & 1 & 0 & 0 & 1 & 1 & 1 & 0 \\ 1 & 0 & 1 & 0 & 1 & 1 & 0 & 1 \\ 0 & 1 & 0 & 1 & 0 & 1 & 1 & 0 \\ 0 & 0 & 1 & 0 & 1 & 0 & 1 & 1 \\ 0 & 0 & 0 & 1 & 0 & 1 & 0 & 1 \end{bmatrix} \quad (11)$$

According to the definition, $$Y = \begin{bmatrix} y_0 \\ y_1 \\ y_2 \\ y_3 \\ y_4 \\ y_5 \\ y_6 \\ y_7 \end{bmatrix} = \begin{bmatrix} 0 & 0 & 0 & 0 & 1 & 0 & 1 & 0 \\ 0 & 0 & 0 & 0 & 0 & 1 & 0 & 1 \\ 1 & 0 & 0 & 0 & 1 & 0 & 0 & 0 \\ 0 & 1 & 0 & 0 & 1 & 1 & 1 & 0 \\ 1 & 0 & 1 & 0 & 1 & 1 & 0 & 1 \\ 0 & 1 & 0 & 1 & 0 & 1 & 1 & 0 \\ 0 & 0 & 1 & 0 & 1 & 0 & 1 & 1 \\ 0 & 0 & 0 & 1 & 0 & 1 & 0 & 1 \end{bmatrix} \cdot \begin{bmatrix} x_0 \\ x_1 \\ x_2 \\ x_3 \\ x_4 \\ x_5 \\ x_6 \\ x_7 \end{bmatrix} = \quad (12)$$

$$\begin{bmatrix} x_4 + x_6 \\ x_5 + x_7 \\ x_0 + x_4 \\ x_1 + x_4 + x_5 + x_6 \\ x_0 + x_2 + x_4 + x_5 + x_7 \\ x_1 + x_3 + x_5 + x_6 \\ x_2 + x_4 + x_6 + x_7 \\ x_3 + x_5 + x_7 \end{bmatrix}$$

For example, if X=83, then Y=8, as given below:

$$\begin{bmatrix} x_0 \\ x_1 \\ x_2 \\ x_3 \\ x_4 \\ x_5 \\ x_6 \\ x_7 \end{bmatrix} = \begin{bmatrix} 1 \\ 1 \\ 0 \\ 0 \\ 1 \\ 0 \\ 1 \\ 0 \end{bmatrix},$$

$$\begin{bmatrix} y_0 \\ y_1 \\ y_2 \\ y_3 \\ y_4 \\ y_5 \\ y_6 \\ y_7 \end{bmatrix} = \begin{bmatrix} x_4 + x_6 \\ x_5 + x_7 \\ x_0 + x_4 \\ x_1 + x_4 + x_5 + x_6 \\ x_0 + x_2 + x_4 + x_5 + x_7 \\ x_1 + x_3 + x_5 + x_6 \\ x_2 + x_4 + x_6 + x_7 \\ x_3 + x_5 + x_7 \end{bmatrix} = \begin{bmatrix} 1+1 \\ 0+0 \\ 1+1 \\ 1+1+0+1 \\ 1+0+1+0+0 \\ 1+0+0+1 \\ 0+1+1+0 \\ 0+0+0 \end{bmatrix} = \begin{bmatrix} 0 \\ 0 \\ 0 \\ 1 \\ 0 \\ 0 \\ 0 \\ 0 \end{bmatrix}$$

If the value of Y is computed using the conventional technique by looking up the log table/inverse log table, then $$Y = 20 \cdot 83 = 2^{206} \cdot 2^{52} = 2^{206+52} = 2^{258} = 2^{258-255} = 2^3 = 8$$

which is the same as the result computed by the disclosed technique of the invention.

Explanation of the Algorithm

The disclosed algorithm of the invention allows the operations of a huge amount of Galois Field multiplication to proceed at the same time, particularly the multiplication operations of a constant with a lot of different numbers. Therefore, it speeds up the operations in a RAID system.

Please refer to FIG. 1. According to one embodiment of the invention, the disclosed method includes three steps. First, the domain of GF($2^a$) of the Galois Field is determined. The map tables of all values in GF($2^a$) are produced according to the algebraic rules of the Galois Field and stored in the memory (step 200). Secondly, the XOR operation unit is enlarged to appropriate w bits. Therefore, the multiplication unit is enlarged to be w·a bits (step 300). Thirdly, according to the stored map tables and its operational rules, each data sector of w bits in the multiplication unit are selected as an XOR operation unit for the XOR operation when the system computes the multiplication of the Galois Field on-line (step 400). Wherein, the map tables mentioned in the first step can be generated in real time while processing data operations, instead of being all generated right after the system is turned on. However, if all the map tables can be generated right after the system is power on, it will be more convenient for subsequent operations. On the other hand, if the required map tables are too many and not suitable for production and storage at a time, then real-time generation during the operation is another feasible option.

How to generate the map tables (step 200) is already described above.

The technique of how to enlarge the XOR operation unit to w bits (step 300) is described as follows.

According to the definition of the map table, i.e. Eq. (9), $y_i$ and $x_i$ denote the i-th bit of Y and X, respectively, where Y and X are numbers in GF($2^a$). It implies that when the map tables are used for conventional operations, the XOR operation unit is 1 bit and the multiplication unit is a number in GF($2^a$). The disclosed method of the invention enlarges the XOR operation unit to w bits, and thus the multiplication unit is enlarged to w·a bits. Take GF($2^8$) as an example. If setting w=32, then the XOR operation unit has 32 bits according to the invention, and the multiplication unit has 32·8=256 bits=32 bytes, namely, the set of 32 numbers in GF($2^8$).

One of the chief considerations of selecting the length of the XOR operation unit to be w is the system hardware environment. For example, the consideration could be the operation unit of the CPU or dedicated parity engine or the width of the data bus. If the operation unit of the CPU or dedicated parity engine is 32 bits, then w=32 is an appropriate choice. If the operation unit of the CPU or dedicated parity engine is 64 bits, then setting w=64 is suitable. Of course, it does not imply that the choice of w is necessarily limited to be the same as the length of the operation unit of the CPU or dedicated parity engine. Different w values may be used in other embodiments of the invention.

Another factor influencing the value of w is considering that the basic storage unit (a sector) of the disks had better be an integer multiple of the multiplication unit. Take GF($2^8$) as an example. If setting w=20, then the multiplication unit has 20·8=160 bits=20 bytes. The basic storage unit, i.e. a sector, of the disks usually has 512 bytes. Since 512 is not an integer multiple of 20, therefore additional operations have to be performed when the multiplication unit is incomplete.

After determining the value of w, the system can perform online multiplication of the Galois Field according to the map tables (step 400). The multiplication may be performed for computing a parity or lost user data. The operation rule is still following Eq. (9). However, the XOR operation unit is enlarged to an appropriate w bits, and the multiplication unit is enlarged to w·a bits. That is, both $y_i$ and $x_i$ have w bits, and both Y and X have w·a bits.

In the following, an embodiment is used to explain the disclosed method. If it is the intention to calculate the product of $Y=20 \cdot X$ in $GF(2^8)$. X is a 32-byte data sector. In the hexadecimal number system, X is represented as follows:

$$X = \begin{array}{cccc} B_0 & B_4 & B_8 & B_{12} \\ |25\ 2a\ 1b\ 33| & 52\ 6a\ 11\ 90| & 80\ 46\ 7c\ ab| & 6e\ 21\ 5b\ 44| \\ B_{16} & B_{20} & B_{24} & B_{28} \\ |a5\ 42\ 78\ 03| & 77\ 25\ 19\ 64| & 01\ 92\ 47\ 86| & 22\ 55\ 9a\ 76| \end{array}$$

where the 0-th byte of X is denoted by $B_0$, the first byte by $B_1$, the second byte by $B_2$, and so on, until $B_{31}$.

According to the disclosed method, the RAID system computes and stores all the map tables when its starts. Therefore, the map table associated with 20 is already given. Suppose the system CPU is 32-bit. Therefore, w is set to be 32. In this case, Y and X are considered to be the data series composed of 8 units, given as:

$$Y = y_0 y_1 y_2 y_3 y_4 y_5 y_6 y_7$$

$$X = x_0 x_1 x_2 x_3 x_4 x_5 x_6 x_7$$

where $y_i$ and $x_i$ represent operation units consisting of 32 bits (4 bytes), $0 \le i \le 7$.

$$\text{Set } X = \begin{array}{cccc} x_0 & x_1 & x_2 & x_3 \\ |25\ 2a\ 1b\ 33| & 52\ 6a\ 11\ 90| & 80\ 46\ 7c\ ab| & 6e\ 21\ 5b\ 44| \\ x_4 & x_5 & x_6 & x_7 \\ |a5\ 42\ 78\ 03| & 77\ 25\ 19\ 64| & 01\ 92\ 47\ 86| & 22\ 55\ 9a\ 76| \end{array}$$

The map table of the constant 20 is already given in Eq. (11). Using Eqs. (9) and (12), one obtains (in the hexadecimal system):

$$y_0 = x_4 + x_6 = (a5\ 42\ 78\ 03) + (01\ 92\ 47\ 86) = (a4\ d0\ 3f\ 85)$$

$$y_1 = x_5 + x_7 = (77\ 25\ 19\ 64) + (22\ 55\ 9a\ 76) = (55\ 70\ 83\ 12)$$

$$y_2 = x_0 + x_4 = (25\ 2a\ 1b\ 33) + (a5\ 42\ 78\ 03) = (80\ 68\ 63\ 30)$$

$$y_3 = x_1 + x_4 + x_5 + x_6 = (52\ 6a\ 11\ 90) + (a5\ 42\ 78\ 03) + (77\ 25\ 19\ 64) + (01\ 92\ 47\ 86) = (81\ 9f\ 37\ 71)$$

$$y_4 = x_0 + x_2 + x_4 + x_5 + x_7 = (25\ 2a\ 1\ 33) + (80\ 46\ 7c\ ab) + (a5\ 42\ 78\ 03) + (77\ 25\ 19\ 64) + (01\ 92\ 47\ 86) = (55\ 5e\ 9c\ 89)$$

$$y_5 = x_1 + x_3 + x_5 + x_6 = (52\ 6a\ 11\ 90) + (6e\ 21\ 5b\ 44) + (77\ 25\ 19\ 64) + (01\ 92\ 47\ 86) = (4a\ fc\ 14\ 36)$$

$$y_6 = x_2 + x_4 + x_6 + x_7 = (80\ 46\ 7c\ ab) + (a5\ 42\ 78\ 03) + (01\ 92\ 47\ 86) + (22\ 55\ 9a\ 76) = (06\ c3\ d9\ 58)$$

$$y_7 = x_3 + x_5 + x_7 = (6e\ 21\ 5b\ 44) + (77\ 25\ 19\ 64) + (22\ 55\ 9a\ 76) = (3b\ 51\ d8\ 56)$$

Therefore, $$Y = |a4\ d0\ 3f\ 85|55\ 70\ 83\ 12|80\ 68\ 63\ 30|81\ 9f\ 37\ 71||55\ 5e\ 9c\ 89|4a\ fc\ 14\ 36|06\ c3\ d9\ 58|3b\ 51\ d8\ 56|$$

The above example assumes that the length of X is 32 bytes. If the length of X is greater than 32 bytes, then X is divided into groups each composed of 32 bytes. Each group of 32 byte forms a multiplication unit. Therefore, the product Y can be obtained by repeating the above operations.

Features of the Algorithm

Using the disclosed algorithm of the invention on the RAID system, the obtained parity is different from that obtained in the prior art. However, its effect and the way of application are completely the same as the prior art.

For example, suppose $D_0$, $D_1$, and $D_2$ are three disk drives for storing user data, which are 32-byte data series, shown as follows (expressed in the hexadecimal system):

$$D_0 = \begin{array}{cccc} B_0 & B_4 & B_8 & B_{12} \\ |2a\ 16\ 10\ 36|50\ 14\ 18\ 66|5c\ 01\ 06\ 12|35\ 7e\ 46\ 0a| \\ B_{16} & B_{20} & B_{24} & B_{28} \\ |1a\ 39\ 6f\ 17|59\ 75\ 48\ 5d|2a\ 07\ 57\ 39|0f\ 30\ 21\ 30| \end{array}$$

$$D_1 = \begin{array}{cccc} B_0 & B_4 & B_8 & B_{12} \\ |19\ 38\ 25\ 26|0c\ 49\ 57\ 51|6a\ 35\ 27\ 65|23\ 09\ 62\ 28| \\ B_{16} & B_{20} & B_{24} & B_{28} \\ |58\ 7f\ 5d\ 7e|12\ 15\ 5d\ 7a|3d\ 48\ 4c\ 6b|5b\ 40\ 74\ 4c| \end{array}$$

$$D_2 = \begin{array}{cccc} B_0 & B_4 & B_8 & B_{12} \\ |7c\ 1c\ 5d\ 22|3d\ 61\ 7d\ 3c|75\ 2b\ 3e\ 70|14\ 4e\ 42\ 18| \\ B_{16} & B_{20} & B_{24} & B_{28} \\ |6d\ 0d\ 6e\ 05|31\ 55\ 78\ 47|3b\ 72\ 67\ 70|1f\ 0b\ 14\ 3e| \end{array}$$

where $B_0$ denotes the 0-th byte, $B_1$ the first byte, and so on, until $B_{31}$. The RAID6 system comprising the three user data disk drives requires additional two party data disk drives for storing parities P and Q. According to Eqs. (1) and (2), one obtains:

$$P = D_0 + D_1 + D_2$$

$$Q = 2^0 \cdot D_0 + 2^1 \cdot D + 2^2 \cdot D_2$$

In the prior art, the values of P and Q in $GF(2^8)$ are computed as follows:

$$P = \begin{array}{cccc} B_0 & B_4 & B_8 & B_{12} \\ |4f\ 32\ 68\ 32|61\ 3c\ 32\ 0b|43\ 1f\ 1f\ 07|02\ 39\ 66\ 3a| \\ B_{16} & B_{20} & B_{24} & B_{28} \\ |2f\ 4b\ 5c\ 6c|7a\ 35\ 6d\ 60|2c\ 3d\ 7c\ 22|4b\ 7b\ 41\ 42| \end{array}$$

$$Q = \begin{array}{cccc} B_0 & B_4 & B_8 & B_{12} \\ |f5\ 16\ 33\ f2|bc\ 1f\ 5f\ 34|41\ c7\ b0\ 05|23\ 49\ 97\ 3a| \\ B_{16} & B_{20} & B_{24} & B_{28} \\ |03\ f3\ 70\ ff|b9\ 16\ 0f\ a8|bc\ 42\ 4e\ 32|c5\ 9c\ 99\ 50| \end{array}$$

Using the disclosed method of the invention, the P value is unchanged. The value of Q is as follows (assuming w=32):

$$Q = \begin{array}{cccc} B_0 & B_4 & B_8 & B_{12} \\ |4a\ 24\ 03\ 0a|56\ 27\ 29\ 7e|4c\ 66\ 1f\ 5d|1d\ 13\ 1b\ 51| \\ B_{16} & B_{20} & B_{24} & B_{28} \\ |33\ 22\ 34\ 4d|0a\ 4f\ 43\ 05|55\ 1f\ 64\ 46|03\ 2d\ 15\ 1c| \end{array}$$

Suppose the data in $D_0$ and $D_2$ are damaged, they can be recovered by using $D_1$, P, and Q. Using Eqs. (3), (4), (5), (6), (7), and (8), one obtains:

$$x=0, y=2, A=166, B=167;$$

$$D_0=166 \cdot P+167 \cdot Q+245 \cdot D_1$$

$$D_2=P+D_1+D_0 \quad (13)$$

1. In the prior art, each byte is computed one by one to solve:

$166 \cdot P = |e\ 9a\ d2\ 9a|2d\ 30\ 9a\ ae|05\ be\ be\ 55|51\ 34\ 78\ c3||75\ 5c\ bb\ 70|31\ cf\ d6\ 8b|82\ 96\ c2\ 28|5c\ 97\ 54\ a3|$ $167 \cdot Q = |31\ 57\ 0f\ 63|75\ a1\ 13\ 5d|15\ 99\ 82\ 01|ad\ 44\ 89\ f9||f4\ c4\ 49\ 33|74\ 57\ 03\ 71|75\ e1\ 16\ a8|ca\ 2c\ 2d\ 10|$ $245 \cdot D_1 = |e5\ db\ cd\ cf|08\ 85\ 91\ 95|4c\ 26\ 3a\ 46|c9\ 0e\ b7\ 30||9b\ a1\ 9d\ 54|1c\ ed\ 9d\ a7|dd\ 70\ 83\ b9|99\ 8b\ 58\ 83|$ Therefore, $D_0 = |2a\ 16\ 10\ 36|50\ 14\ 18\ 66|5c\ 01\ 06\ 12|35\ 7e\ 46\ 0a||1a\ 39\ 6f\ 17|59\ 75\ 48\ 5d|2a\ 07\ 57\ 39|0f\ 30\ 21\ 30|$ $D_2$ is then obtained by substituting $D_0$ in Eq. (13).

2. According to the disclosed method of the invention, one obtains:

$166 \cdot P = |52\ 4b\ 78\ 13|0f\ 5b\ 57\ 7b|4f\ 32\ 68\ 32|33\ 77\ 4a\ 18||51\ 3d\ 58\ 5d|3e\ 15\ 7b\ 59|7e\ 76\ 04\ 31|44\ 20\ 16\ 39|$ $167 \cdot Q = |08\ 72\ 67\ 3c|36\ 58\ 65\ 22|06\ 42\ 1c\ 57|09\ 62\ 56\ 19||17\ 49\ 00\ 70|63\ 52\ 59\ 40|42\ 56\ 64\ 36|60\ 7f\ 4c\ 5c|$ $245 \cdot D_1 = |70\ 2f\ 0f\ 19|69\ 17\ 2a\ 3f|15\ 71\ 72\ 77|0f\ 6b\ 5a\ 0b||5c\ 4d\ 37\ 3a|04\ 32\ 6a\ 44|16\ 27\ 37\ 3e|2b\ 6f\ 7b\ 55|$ Therefore, $D_0 = |2a\ 16\ 10\ 36|50\ 14\ 18\ 66|5c\ 01\ 06\ 12|35\ 7e\ 46\ 0a||1a\ 39\ 6f\ 17|59\ 75\ 48\ 5d|2a\ 07\ 57\ 39|0f\ 30\ 21\ 30|$ Likewise, $D_2$ is obtained by substituting $D_0$ in Eq. (13).

The above example reveals that even though the value of Q obtained by the techniques disclosed in the invention is different from the one computed by the prior art, however, the functions of protecting and recovering the user data are identical to the one in the prior art.

Correctness of the Algorithm and its Mathematical Meaning

Take $GF(2^8)$ as an example. Suppose Y and X are composed of 8 XOR operation units, each of which has a length of w bits. Here w is an appropriate number, such as 32 in the previous example. Y and X are represented in a vector format as follows, $$Y = \begin{bmatrix} y_0 \\ y_1 \\ y_2 \\ \vdots \\ y_7 \end{bmatrix}, \quad X = \begin{bmatrix} x_0 \\ x_1 \\ x_2 \\ \vdots \\ x_7 \end{bmatrix}$$

where $y_i$ and $x_i$ are w-bit numbers and $0 \le i \le 7$.

Let $Y = K \cdot X$, where K is a constant whose map table is the matrix $M_K$. Then $$y_i = \sum_{j=0}^{7} (m_{i,j} \cdot x_j),$$

wherein $0 \le i \le 7$

That is, $$y_0 = \sum_{j=0}^{7} (m_{0,j} \cdot x_j)$$

$$y_1 = \sum_{j=0}^{7} (m_{1,j} \cdot x_j)$$

$$y_2 = \sum_{j=0}^{7} (m_{2,j} \cdot x_j)$$

$$y_3 = \sum_{j=0}^{7} (m_{3,j} \cdot x_j)$$

$$y_4 = \sum_{j=0}^{7} (m_{4,j} \cdot x_j)$$

$$y_5 = \sum_{j=0}^{7} (m_{5,j} \cdot x_j)$$

$$y_6 = \sum_{j=0}^{7} (m_{6,j} \cdot x_j)$$

$$y_7 = \sum_{j=0}^{7} (m_{7,j} \cdot x_j)$$

Let $y_{i,j}$ and $x_{i,j}$ denote the j-th bits of $y_i$ and $x_i$, respectively, where $0 \le i \le 7$ and $0 \le j \le w-1$. Since both $y_i$ and $x_i$ have w bits, the above equations can be unfolded as follows:

$$y_{0,0} = \sum_{j=0}^{7} (m_{0,j} \cdot x_{j,0}) \quad (14)$$

$$y_{0,1} = \sum_{j=0}^{7} (m_{0,j} \cdot x_{j,1}),$$

… and so forth until $y_{0,w-1} = \sum_{j=0}^{7} (m_{0,j} \cdot x_{j,w-1})$ $$y_{1,0} = \sum_{j=0}^{7} (m_{1,j} \cdot x_{j,0}) \quad (15)$$

$$y_{1,1} = \sum_{j=0}^{7} (m_{1,j} \cdot x_{j,1}),$$

… and so forth until $y_{1,w-1} = \sum_{j=0}^{7} (m_{1,j} \cdot x_{j,w-1})$ $$y_{2,0} = \sum_{j=0}^{7} (m_{2,j} \cdot x_{j,0}) \quad (16)$$

$$y_{2,1} = \sum_{j=0}^{7} (m_{2,j} \cdot x_{j,1}),$$

… and so forth until $y_{2,w-1} = \sum_{j=0}^{7} (m_{2,j} \cdot x_{j,w-1})$

-continued $$y_{3,0} = \sum_{j=0}^{7} (m_{3,j} \cdot x_{j,0}) \quad (17)$$

$$y_{3,1} = \sum_{j=0}^{7} (m_{3,j} \cdot x_{j,1}),$$

$$\ldots \text{ and so forth until } y_{3,w-1} = \sum_{j=0}^{7} (m_{3,j} \cdot x_{j,w-1})$$

$$y_{4,0} = \sum_{j=0}^{7} (m_{4,j} \cdot x_{j,0}) \quad (18)$$

$$y_{4,1} = \sum_{j=0}^{7} (m_{4,j} \cdot x_{j,1}),$$

$$\ldots \text{ and so forth until } y_{4,w-1} = \sum_{j=0}^{7} (m_{4,j} \cdot x_{j,w-1})$$

$$y_{5,0} = \sum_{j=0}^{7} (m_{5,j} \cdot x_{j,0}) \quad (19)$$

$$y_{5,1} = \sum_{j=0}^{7} (m_{5,j} \cdot x_{j,1}),$$

$$\ldots \text{ and so forth until } y_{5,w-1} = \sum_{j=0}^{7} (m_{5,j} \cdot x_{j,w-1})$$

$$y_{6,0} = \sum_{j=0}^{7} (m_{6,j} \cdot x_{j,0}) \quad (20)$$

$$y_{6,1} = \sum_{j=0}^{7} (m_{6,j} \cdot x_{j,1}),$$

$$\ldots \text{ and so forth until } y_{6,w-1} = \sum_{j=0}^{7} (m_{6,j} \cdot x_{j,w-1})$$

$$y_{7,0} = \sum_{j=0}^{7} (m_{7,j} \cdot x_{j,0}) \quad (21)$$

$$y_{7,1} = \sum_{j=0}^{7} (m_{7,j} \cdot x_{j,1}),$$

$$\ldots \text{ and so forth until } y_{7,w-1} = \sum_{j=0}^{7} (m_{7,j} \cdot x_{j,w-1})$$

Analyzing Eqs. (14) to (21), one finds:

$$\begin{bmatrix} y_{0,0} \\ y_{1,0} \\ y_{2,0} \\ \vdots \\ y_{7,0} \end{bmatrix} = \begin{bmatrix} m_{0,0} & m_{0,1} & m_{0,2} & \ldots & m_{0,7} \\ m_{1,0} & m_{1,1} & m_{1,2} & \ldots & m_{1,7} \\ m_{2,0} & m_{2,1} & m_{2,2} & \ldots & m_{2,7} \\ \vdots & \vdots & \vdots & & \vdots \\ m_{7,0} & m_{7,1} & m_{7,2} & \ldots & m_{7,7} \end{bmatrix}_K \cdot \begin{bmatrix} x_{0,0} \\ x_{1,0} \\ x_{2,0} \\ \vdots \\ x_{7,0} \end{bmatrix}$$

That is, $(y_{0,0}\ y_{1,0} \ldots y_{7,0})$ and $(x_{0,0}\ x_{1,0} \ldots x_{7,0})$ satisfy the definition of the map table in Eq. (9). Therefore, the former one is the product of K and the latter one in the Galois Field. Likewise, the numbers of $(y_{0,j}\ y_{1,j} \ldots y_{7,j})$ for all j satisfying $0 \le j \le w-1$ are the products of K and $(x_{0,j}\ x_{1,j} \ldots x_{7,j})$.

The above-mentioned analysis provides a mathematical meaning for the disclosed technique. Please refer to FIG. 3 and take $GF(2^8)$ as an example. The Galois Field products obtained according to the invention is equivalent to the results obtained from the following steps:

1. Read the data sector with a length of (w·8) bits, where w is an appropriate value as described above.

2. In the data sector, start from the i-th bit and pick one bit every w bits, until it forms a $GF(2^8)$ number $x_i$, wherein $0 \le i \le 7$.

3. Obtain $y_i = K \cdot x_i$, wherein $0 \le i \le 7$, using the conventional techniques.

4. Store $y_i$ back to the memory address where stores the final multiplication product. The location of each bit of $y_i$ should move back to the one corresponding to the original location in $x_i$, wherein $0 \le i \le 7$.

From the viewpoint of the "equivalent method" mentioned above, the disclosed method of the invention still follows the algebraic principles of the Galois Field. The difference from the prior art is the way of data sampling. That is, the disclosed method of the invention can be regarded as being equivalent to sampling one bit every w bits in the data sector until a $GF(2^a)$ number is obtained.

Figure 3:
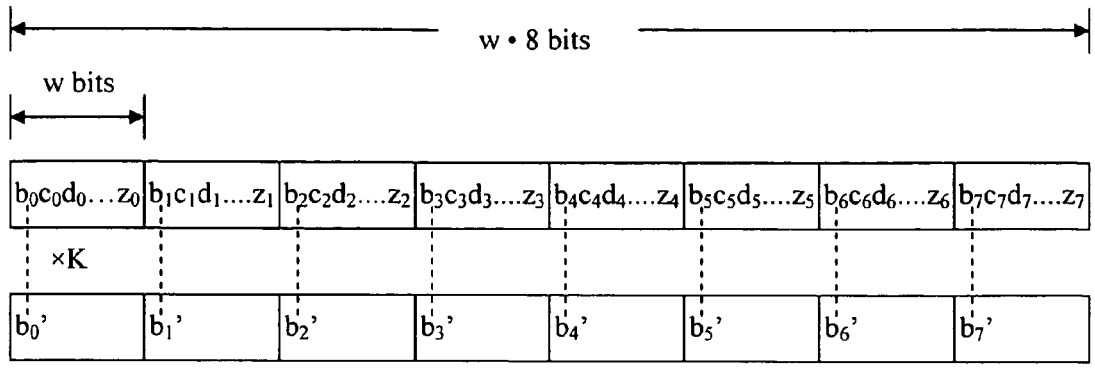
FIG. 3 is a schematic view of sampling data according to the invention.
Figure 3:
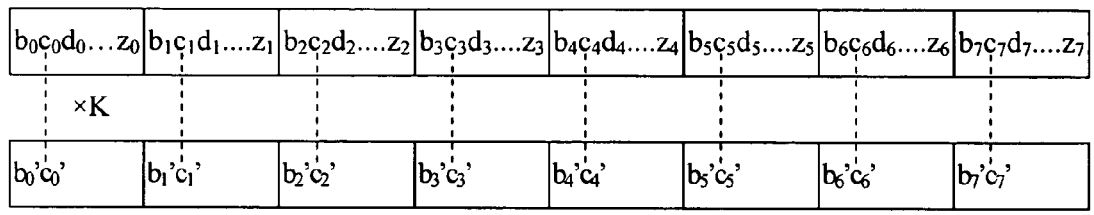
Figure 3:
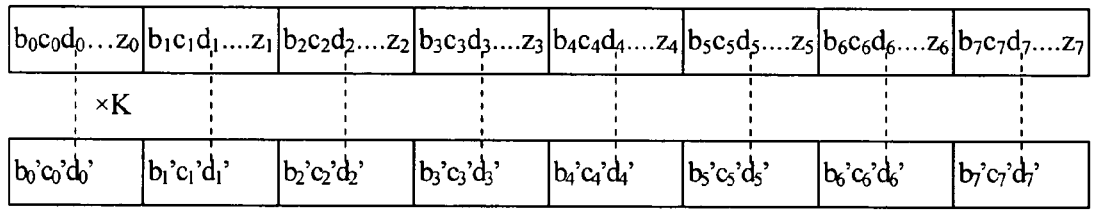
Figure 3:
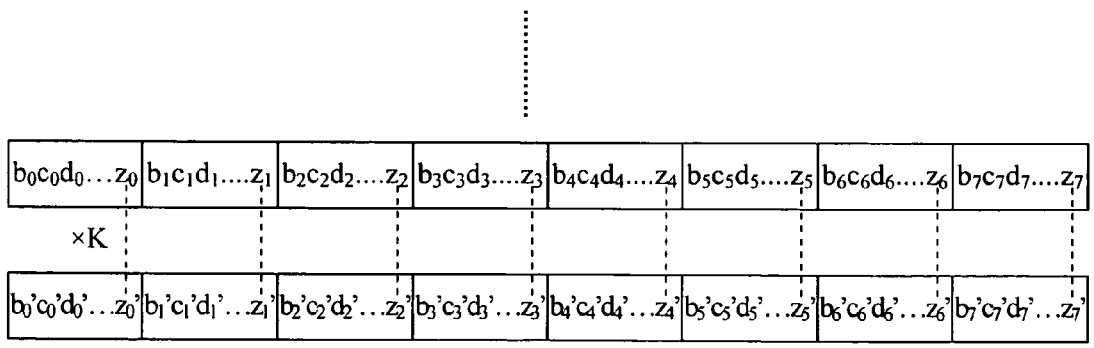

For example, as shown in FIG. 3, suppose an XOR operation unit has w bits of a data length, and 8 XOR operation units form a multiplication unit. One embodiment of the invention is considered to be equivalent to the multiplication result outlined in the following steps. Step1, pick the first bit of each XOR operation unit to form an 8-bit number $(b_0 b_1 b_2 b_3 b_4 b_5 b_6 b_7)$. Multiply K by $(b_0 b_1 b_2 b_3 b_4 b_5 b_6 b_7)$ to obtain $(b_0' b_1' b_2' b_3' b_4' b_5' b_6' b_7')$. Then, put each bit of $(b_0' b_1' b_2' b_3' b_4' b_5' b_6' b_7')$ back to the corresponding location where the original $(b_0 b_1 b_2 b_3 b_4 b_5 b_6 b_7)$ comes from. Step 2, perform the operation with the same K on the number $(c_0 c_1 c_2 c_3 c_4 c_5 c_6 c_7)$ formed by picking the second bit of each XOR operation unit and then obtain $(c_0' c_1' c_2' c_3' c_4' c_5' c_6' c_7')$. Put each bit of $(c_0' c_1' c_2' c_3' c_4' c_{50}' c_6' c_7')$ back to the corresponding location where the original $(c_0 c_1 c_2 c_3 c_4 c_5 c_6 c_7)$ comes from. This procedure repeats until all the w·8 bits are computed.

Figure 4:
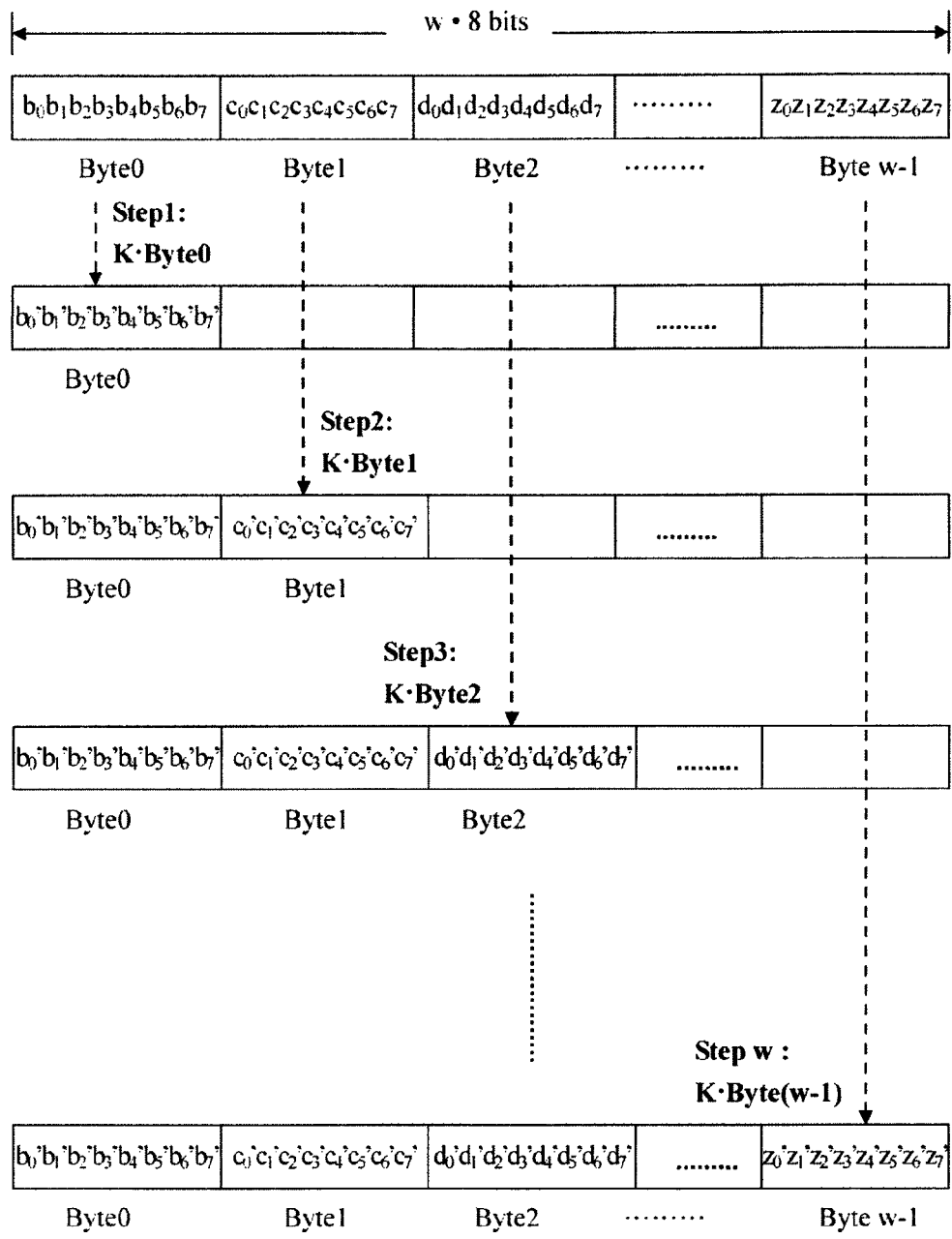
FIG. 4 is a schematic view of sampling data in the prior art.

In contrast, the prior art samples data in sequence, as shown in FIG. 4. The product of each byte with K has to be computed one by one. Therefore, it is difficult to enlarge the data amount computed so as to speed up the operation.

From the equivalent point of view mentioned above, although the invention has different sampling method from the prior art, this does not affect the correctness of Eqs. (2) to (8). Therefore, the functions of data protecting and recovering remain the same.

The above-mentioned "equivalent method" is only for explaining the essence of the invention. In practice, the disclosed method of the invention can simultaneously compute several Galois Field products, thereby increasing the operation speed of the RAID system. This advantage originates from the special data sampling method in the "equivalent method".

System Structure Using the Disclosed Algorithm

Figure 5:
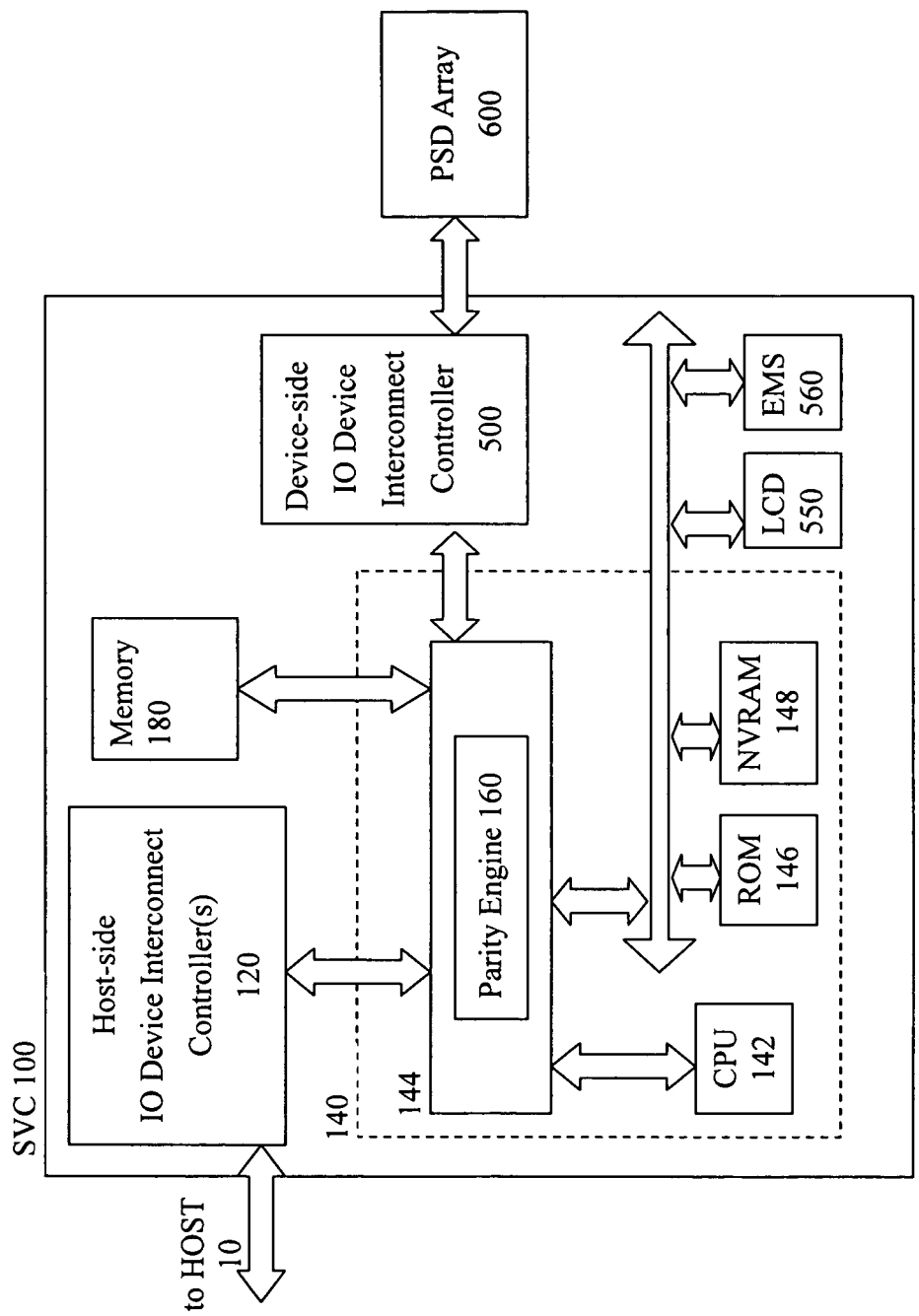
FIG. 5 is a schematic view of an embodiment of the disclosed disk subsystem employing the method of the invention.

In an embodiment of the invention, the disclosed method is applied to a redundant array of independent disk (RAID) subsystem. With reference to FIG. 5, the physical storage device (PSD) array 600 consists of several disk drives. When a host 10 accesses the PSD array 600, the entire PSD array 600 is regarded as a single logic disk drive. The primary objective of a storage virtualization controller (SVC) 100 is to map the combination of all sectors in the disk drives to form a logic disk drive visible to the host 10. After an I/O request sent out from the host 10 is received by the controller 100, the I/O request is first analyzed and interpreted. The related operations and data are then compiled into I/O requests of the disk drives.

In this embodiment, the SVC 100 comprises a host-side I/O device interconnect controller 120, a central processing circuit (CPC) 140, a memory 180, and a device-side I/O device interconnect controller 500. Although these components are described using individual functional blocks, in practice some or even all the functional blocks can be integrated on a single chip.

The host-side I/O device interconnect controller 120 is connected to the host 10 and the CPC 140 to be the interface and buffer between the SVC 100 and the host 10. It receives the I/O requests and the related data transmitted from the host 10 and converts and/or maps them to the CPC 140.

The memory 180 is connected to the CPC 140 to be a buffer. It buffers the data transmitted between the host 10 and the PSD array 600 that pass through the CPC 140.

The device-side I/O device interconnect controller 500 is disposed between the CPC 140 and the PSD array 600 to be the interface and buffer between the SVC 100 and the PSD array 600. The device-side I/O device interconnect controller 500 receives the I/O requests and the related data transmitted from the CPC 140 and maps and/or transmits them to the PSD array 600.

The CPC 140 includes a CPU chipset 144 that has a parity engine 160, a central processing unit (CPU) 142, a read only memory (ROM) 146, and a non-volatile random access memory (NVRAM) 148. The CPU 142 can be, for example, a Power PC CPU. The ROM 146 can be a flash memory for storing the basic input/output system (BIOS) and/or other programs. The CPU 142 is coupled via the CPU chipset 144 to other electronic devices (e.g., the memory 180). The NVRAM 148 is used to store information related to the status of I/O operations on the PSD array 600, so that the information can be used as a check when the power is unexpectedly shut down before the I/O operations are finished. The ROM 146, the NVRAM 148, an LCD module 550, and an enclosure management service (EMS) circuit 560 are coupled to the CPU chipset 144 via an X-bus. Moreover, the NVRAM 148 is optional; namely, it may be omitted in other embodiment. Although the CPU chipset 144 is described as a functional block integrated with the parity engine 160, they can be disposed separately on different chips in practice.

In an embodiment of the invention, the target data processed in the multiplication operations may come from the PSD array 600 or the host 10. The multiplication result may be stored in the memory 180, the disk drives of the PSD 600, or the buffer built in the parity engine 160 or the CPU 142 (not shown in the drawing). The algorithm of the invention is implemented by program coding. The program can be stored in the ROM 146 or the memory 180 for the CPC 140 to execute. In other words, the CPC 140 is responsible for generating map tables corresponding to the numbers in a field domain (e.g., GF($2^8$)) during power on or on line. The generated map tables can be stored in the memory 180. In another embodiment of the invention, all the necessary map tables can be computed in advance and stored in the ROM 146 or the memory 180 so that the CPC 140 only needs to access the stored map tables after power on. During the online real-time operations, for a given multiplication unit, an XOR operation unit is taken as an unit to perform an XOR operation on the target data stored in the memory according to the map tables. The multiplication result is then obtained after several the XOR operations.

Although in the above embodiment, disks are taken as an example for the physical storage devices (PSDs) used in the RAID subsystem, it is noted that other kinds of physical storage devices, such as CD, DVD, etc., can be used alternatively, depending on different demands of the market.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for processing data multiplication in a physical storage device (PSD) array, comprising the steps of:
   providing at least one memory for temporarily storing target data provided by a data source;
   providing a central processing circuit (CPC), generating or accessing at least one map table each associated with one value in a field, and storing the at least one map table in the at least one memory, wherein said at least one map table has a dimension of "a" by "a", and "a" is a positive integer larger than one;
   defining an XOR operation unit as a length of data of "w" bits for performing an XOR operation such that the data length of the XOR operation unit is "w" bits, wherein "w" is a positive integer larger than one;
   defining a multiplication unit as a length of data consisting of "a" XOR operation units for performing a multiplication operation such that the data length of the multiplication unit is "a" multiplying "w" bits, said target data being of a length of the multiplication unit and containing "a" XOR operation units;
   performing a multiplication operation on the target data to obtain a multiplication result, comprising performing a plurality of XOR operations on the target data according to the at least one map table, wherein each of the plurality of XOR operations is performed on a part of the target data, said part of the target data being data in one of the "a" XOR operation units; and
   storing the multiplication result in the at least one memory;
   wherein the plurality of XOR operations are performed by a dedicated parity engine; and
   wherein the length of the XOR operation unit "w" bits is independent of "a".

2. The method of claim 1, wherein a plurality of the multiplication results are further computed by the plurality of XOR operations to obtain a parity or a user data set.

3. The method of claim 2, wherein the parity is obtained using the following formula:

$$Q = g^0 \cdot D_0 + g^1 \cdot D_1 + g^2 \cdot D_2 + \ldots + g^{n-1} \cdot D_{n-1}$$

where g is a generator of a Galois Field and given to be 2; $D_0, D_1, D_2, \ldots, D_{n-1}$ denote user data series of n number of user data PSDs, respectively; "+" represents an XOR operation; and "·" represents the multiplication operation of the Galois Field.

4. The method of claim 1, wherein the user data set is obtained using the following formula:

$$D_x = A \cdot (P + P_{xy}) + B \cdot (Q + Q_{xy})$$

$$D_y = (P + P_{xy}) + D_x$$

where x and y are the serial numbers of two data PSDs with errors; $D_x$ and $D_y$ are user data corresponding to the two data PSDs x and y; A and B are constants only dependent upon x and y:

$$A = g^{y-x} \cdot (g^{y-x} + 1)^{-1}$$

$$B = g^{-x} \cdot (g^{y-x} + 1)^{-1}$$

$P_{xy}$ and $Q_{xy}$ are the values of P and Q, respectively, when $D_x$ and $D_y$ are both 0, i.e., $$P_{xy} + D_x + D_y = P$$

$$Q_{xy} + g^x \cdot D_x + g^y \cdot D_y = Q$$

where "+" represents an XOR operation; and "·" represents the multiplication operation of the Galois Field.

5. The method of claim 1, wherein the field is a Galois Field.

6. The method of claim 5, wherein the map table is generated according to an algorithmic rule of the Galois Field.

7. The method of claim 6, wherein the algorithmic rule is generated according to the algebraic rules of the Galois Field.

8. The method of claim 6, wherein when the domain of the Galois Field is $GF(2^8)$ the algorithmic rule is:

$$m'_{0,j} = m_{7,j}, 0 \leq j \leq 7$$

$$m'_{1,j} = m_{0,j}, 0 \leq j \leq 7$$

$$m'_{2,j} = m_{1,j} + m_{7,j}, 0 \leq j \leq 7$$

$$m'_{3,j} = m_{2,j} + m_{7,j}, 0 \leq j \leq 7$$

$$m'_{4,j} = m_{3,j} + m_{7,j}, 0 \leq j \leq 7$$

$$m'_{5,j} = m_{4,j}, 0 \leq j \leq 7$$

$$m'_{6,j} = m_{5,j}, 0 \leq j \leq 7$$

$$m'_{7,j} = m_{6,j}, 0 \leq j \leq 7$$

where $m_{0,j} \sim m_{7,j}$ and $m'_{0,j} \sim m'_{7,j}$ with $0 \leq j \leq 7$ are elements of matrixes $M_K$ and $M_{K'}$, respectively, $M_K$ being a given matrix associated with K, $M_{K'}$ being a matrix associated with $K' = 2 \cdot K$ wherein $K \neq 0$.

9. The method of claim 8, wherein when K=0 the matrix $M_0$ is a zero matrix.

10. The method of claim 8, wherein when $K=2^0=1$ the matrix $M_1$ is an identity matrix.

11. The method of claim 1, wherein the plurality of XOR operations are performed according to the following formula:

$$Y = \begin{bmatrix} y_0 \\ y_1 \\ y_2 \\ \vdots \\ y_{a-1} \end{bmatrix} =$$

$$M_K \cdot X = \begin{bmatrix} m_{0,0} & m_{0,1} & m_{0,2} & \cdots & m_{0,a-1} \\ m_{1,0} & m_{1,1} & m_{1,2} & \cdots & m_{1,a-1} \\ m_{2,0} & m_{2,1} & m_{2,2} & \cdots & m_{2,a-1} \\ \vdots & \vdots & \vdots & & \vdots \\ m_{a-1,0} & m_{a-1,1} & m_{a-1,2} & \cdots & m_{a-1,a-1} \end{bmatrix}_K \cdot \begin{bmatrix} x_0 \\ x_1 \\ x_2 \\ \vdots \\ x_{a-1} \end{bmatrix}$$

namely, $$y_i = \sum_{j=0}^{a-1} (m_{ij} \cdot x_j)$$

where $M_K$ is a matrix representing the map table associated with K; $m_{i,j}$ represent elements in the matrix $M_K$ with $0 \leq i, j \leq a-1$, and $$m_{i,j} \cdot x_j = x_j, \text{ if } m_{i,j} = 1$$

$$m_{i,j} \cdot x_j = 0, \text{ if } m_{i,j} = 0$$

where $x_0, x_1, x_2, \ldots,$ and $x_{a-1}$ represent data whose length is the same as the length of the XOR operation unit, respectively, X represents data of the multiplication unit; and Y represents the result of multiplying K by X.

12. The method of claim 8, wherein the XOR operation performed according to the map tables is the one selecting the data of the XOR operation unit whose corresponding elements in the same row of the matrix M are 1 to do the XOR operation.

13. The method of claim 1, wherein the length of the XOR operation unit is determined according to a processing unit of the central processing unit (CPU) or the dedicated parity engine of the PSD array.

14. The method of claim 1, wherein the length of the XOR operation unit is 32 bits or 64 bits.

15. The method of claim 1, wherein the length of the multiplication unit is 32 bytes or 64 bytes.

16. The method of claim 1, wherein the data source is a physical storage device (PSD) array or a computer host.

17. The method of claim 1, wherein the dimension of the map table is dependent on the domain of the field.

18. A controller for processing data multiplication in a physical storage device (PSD) array, comprising:
at least one memory for temporarily storing target data provided by a data source; and
a central processing circuit (CPC) for interacting with the at least one memory, for generating or accessing at least one map table each associated with one value in a field, and storing the at least one map table in the at least one memory;
wherein the CPC is for defining an XOR operation unit as a length of data of "w" bits for performing an XOR operation such that the data length of the XOR operation unit is "w" bits, wherein "w" is a positive integer larger than one;
wherein the CPC is for defining a multiplication unit as a length of data consisting of "a" XOR operation units for performing a multiplication operation such that the data length of the multiplication unit is "a" multiplying "w" bits, said target data being of a length of the multiplication unit and containing "a" XOR operation units;
wherein the CPC is for performing a multiplication operation on the target data to obtain a multiplication result, comprising performing a plurality of XOR operations on the target data according to the at least one map table, wherein each of the plurality of XOR operations is performed on a part of the target data, said part of the target data being data in one of the "a" XOR operation units;
wherein the plurality of XOR operations are performed by a dedicated parity engine; and
wherein the length of the XOR operation unit "w" bits is independent of "a".

19. The controller of claim 18, wherein the CPC further includes a CPU chipset that has the parity engine, a CPU, a read only memory (ROM), and a non-volatile random access memory (NVRAM).

20. The controller of claim 18, wherein the data source is a PSD array or a computer host for providing the target data for the multiplication operation.

21. The controller of claim 20 further comprising a device-side I/O device interconnect controller connected between the PSD array and the CPC as a buffer interface for receiving an I/O request and related data transmitted from the CPC and mapping and/or transmitting them to the PSD array.

22. The controller of claim 20 further comprising a host-side I/O device interconnect controller connected between the host and the CPC as a buffer interface for receiving an I/O request and related data transmitted from the host and converting and/or mapping them to the CPC.

23. The controller of claim 18, wherein the field is a Galois Field and the map table is generated according to an algorithmic rule of the Galois Field.

24. The controller of claim 23, wherein when the domain of the Galois Field is GF($2^8$), the algorithmic rule is:

$m'_{0,j}=m_{7,j}$, $0 \le j \le 7$ $m'_{1,j}=m_{0,j}$, $0 \le j \le 7$ $m'_{2,j}=m_{1,j}+m_{7,j}$, $0 \le j \le 7$ $m'_{3,j}=m_{2,j}+m_{7,j}$, $0 \le j \le 7$ $m'_{4,j}=m_{3,j}+m_{7,j}$, $0 \le j \le 7$ $m'_{5,j}=m_{4,j}$, $0 \le j \le 7$ $m'_{6,j}=m_{5,j}$, $0 \le j \le 7$ $m'_{7,j}=m_{6,j}$, $0 \le j \le 7$ where $m_{0,j} \sim m_{7,j}$ and $m'_{0,j} \sim m'_{7,j}$ with $0 \le j \le 7$ are elements of matrixes $M_K$ and $M_{K'}$, respectively, $M_K$ being a given matrix associated with K, $M_{K'}$ being a matrix associated with $K'=2 \cdot K$ wherein $K \ne 0$.

25. The controller of claim 24, wherein when K=0 the matrix $M_0$ is a zero matrix.

26. The controller of claim 24, wherein when $K=2^0=1$ the matrix $M_1$ is an identity matrix.

27. The controller of claim 18, wherein the plurality of XOR operations are performed according to the following formula:

$$Y = \begin{bmatrix} y_0 \\ y_1 \\ y_2 \\ \vdots \\ y_{a-1} \end{bmatrix} =$$

$$M_K \cdot X = \begin{bmatrix} m_{0,0} & m_{0,1} & m_{0,2} & \ldots & m_{0,a-1} \\ m_{1,0} & m_{1,1} & m_{1,2} & \ldots & m_{1,a-1} \\ m_{2,0} & m_{2,1} & m_{2,2} & \ldots & m_{2,a-1} \\ \vdots & \vdots & \vdots & & \vdots \\ m_{a-1,0} & m_{a-1,1} & m_{a-1,2} & \ldots & m_{a-1,a-1} \end{bmatrix}_K \cdot \begin{bmatrix} x_0 \\ x_1 \\ x_2 \\ \vdots \\ x_{a-1} \end{bmatrix}$$

namely, $$y_i = \sum_{j=0}^{a-1} (m_{ij} \cdot x_j)$$

where $M_K$ is a matrix representing the map table associated with K; $m_{i,j}$ represent elements in the matrix $M_K$ with $0 \le i, j \le a-1$, and $m_{i,j} \cdot x_j = x_j$, if $m_{i,j}=1$ $m_{i,j} \cdot x_j = 0$, if $m_{i,j}=0$ where $x_0, x_1, x_2, \ldots$, and $x_{a-1}$ represent data whose length is the same as the length of the XOR operation unit, respectively, X represents data of the multiplication unit; and Y represents the result of multiplying K by X.

28. The controller of claim 18, wherein the length of the XOR operation unit is determined according to a processing unit of the central processing unit (CPU) or the dedicated parity engine of the PSD array.

29. The controller of claim 18, wherein the length of the XOR operation unit is 32 bits or 64 bits.

30. The controller of claim 18, wherein the length of the multiplication unit is 32 bytes or 64 bytes.

31. A method for processing data multiplication in a physical storage device (PSD) array for computing the product of a number K and a data series X, comprising the steps of:
providing at least one memory for temporarily storing target data provided by a data source;
providing a central processing circuit (CPC) and generating or accessing a map table associated with the number K, and storing the map table in the at least one memory;
defining an XOR operation unit as a length of data of "w" bits for performing an XOR operation such that the data length of the XOR operation unit is "w" bits, wherein "w" is a positive integer larger than one;
defining a multiplication unit as a length of data consisting of "a" XOR operation units for performing a multiplication operation such that the data length of the multiplication unit is "a" multiplying "w" bits, said target data being of a length of the multiplication unit and containing "a" XOR operation units;
performing a multiplication operation on each of the target data of the data series X, comprising performing a plurality of XOR operations on the target data according to the map table, wherein each of the plurality of XOR operations is performed on a part of the target data, said part of the target data being data in one of the "a" XOR operation units; and
obtaining a multiplication result of the number K with the data series X when all the multiplication operations are finished, and storing the multiplication result in the at least one memory;
wherein the plurality of XOR operations are performed by a dedicated parity engine; and
wherein the length of the XOR operation unit "w" bits is independent of "a".

* * * * *